US010410482B2

(12) United States Patent
Clark

(10) Patent No.: US 10,410,482 B2
(45) Date of Patent: Sep. 10, 2019

(54) PROGRAMMABLE AUDIO LEVEL INDICATOR

(71) Applicant: Allen & Heath Ltd, Cornwall (GB)

(72) Inventor: Robin Clark, Cornwall (GB)

(73) Assignee: Allen & Heath Ltd, Cornwall (GB)

( * ) Notice: Subject to any disclaimer, the term of this patent is extended or adjusted under 35 U.S.C. 154(b) by 0 days.

(21) Appl. No.: 16/059,768

(22) Filed: Aug. 9, 2018

(65) Prior Publication Data

US 2019/0066456 A1 Feb. 28, 2019

(30) Foreign Application Priority Data

Aug. 23, 2017 (GB) .................................. 1713573.2

(51) Int. Cl.
| | | |
|---|---|---|
| G08B 5/00 | (2006.01) | |
| G08B 3/10 | (2006.01) | |
| G01R 19/165 | (2006.01) | |
| H04R 29/00 | (2006.01) | |
| G01F 22/02 | (2006.01) | |
| G01F 23/296 | (2006.01) | |
| G01H 3/14 | (2006.01) | |
| G08B 21/18 | (2006.01) | |
| G01R 13/40 | (2006.01) | |

(52) U.S. Cl.
CPC .............. *G08B 3/10* (2013.01); *G01F 22/02* (2013.01); *G01F 23/2966* (2013.01); *G01H 3/14* (2013.01); *G01R 13/406* (2013.01); *G01R 19/16523* (2013.01); *G01R 19/16595* (2013.01); *G08B 21/182* (2013.01); *H04R 29/008* (2013.01)

(58) Field of Classification Search
CPC .......... G08B 3/10; G08B 21/182; G01H 3/14; G01F 22/02; G01F 23/0866; G01R 13/0227; G01R 19/16523; G01R 19/16595; H04R 29/008
USPC .............................. 340/815.46, 815.4, 815.69
See application file for complete search history.

(56) References Cited

U.S. PATENT DOCUMENTS

| 7,228,190 | B2 * | 6/2007 | Dowling | ................. | A63J 17/00 |
| | | | | | 340/815.46 |
| 2011/0075864 | A1 * | 3/2011 | Hagiwara | .............. | H04H 60/04 |
| | | | | | 381/119 |

OTHER PUBLICATIONS

Patents Act 1977: Combined Search and Examination Report Under Sections 17 and 18(3), United Kingdom Intellectual Property Office, Great Britain Patent Application No. GB1713573.2, dated Dec. 1, 2017.

(Continued)

*Primary Examiner* — Toan N Pham
(74) *Attorney, Agent, or Firm* — Reichel Stohry Dean LLP; Mark C. Reichel; Natalie J. Dean

(57) ABSTRACT

Audio level indicators are known which comprise moving needles, or an array of lights, or an illuminated bar. However, the way in which they provide information is fixed. A programmable audio level indicator for use with a mixing desk is provided which comprises a first light source arranged to emit a coloured light, in response to an audio signal received from a connected audio source, to indicate the audio level of that received signal, the indicator arranged to vary the colour and intensity of the light emitted as the audio level changes, wherein the indicator is configured such that the audio levels at which the colour changes are selectable, the indicator further configured such that the colour emitted to indicate an audio level, or range of audio levels, is also selectable.

20 Claims, 3 Drawing Sheets

(56) References Cited

OTHER PUBLICATIONS

Electronics Area, "Audio Level Indicator Using LM339," electronicsarea.com [Online], Available from: https://web.archive.org/web/20170701191143/https://electronicsarea.com/audio-level-indicator-using-lm339/, Accessed Nov. 21, 2017.

* cited by examiner

| Audio Signal State | Audio Level | Colour | Intensity | Light No. |
|---|---|---|---|---|
| Peak OTT Warning | > -3 dBFS | Red | Instant on, no intensity changes with level | 2 |
| Upper Nominal Level | > -8 dBFS | Orange | Instant on, no intensity changes with level | 1 |
| Nominal Level | > -18 dBFS | Yellow | Instant on, no intensity changes with level | 1 |
| Lower Nominal Level | > -30 dBFS | Green | Intensity changes with level | 1 |
| Signal Present | > -48 dBFS | Dark Green/Blue | Intensity changes with level | 1 |
| Audio Present | > -68 dBFS | Dark Blue | Intensity changes with level | 1 |
| No Signal/Connected | < -68 dBFS | Off | Instant on, no intensity changes with level | 1 |

Figure 2

PROGRAMMABLE AUDIO LEVEL INDICATOR

PRIORITY

The present application is related to, and claims the priority benefit of, Great Britain Patent Application Serial No. GB1713573.2, filed Aug. 23, 2017, the contents of which are hereby incorporated into the present disclosure directly and by reference in their entirety.

TECHNICAL FIELD

The present invention relates generally to a programmable audio level indicator and a method of programming an audio level indicator and finds particular, although not exclusive, utility in the operation of mixing desks.

BACKGROUND

Traditional audio signal level meters use light illumination, with variable intensity and colour, in a vertical illuminated bar to display audio signal level (amplitude/voltage or power) of an audio signal. For example, illumination at the bottom of the meter typically indicates a low signal level. Illumination in the middle of the vertical meter indicates nominal/moderate signal levels. Illumination towards the top of the vertical meter indicates high signal levels. The top of the vertical meter also has a peak warning indication, in the form of a different colour, (just before the audio signal is clipping or peaking at the capabilities of the system). Typical colours associated with signal levels are green for low and moderate/nominal levels. Above nominal is typically yellow and higher signals levels are typically associated with yellow/orange. Peak indication is typically a red illumination. Illumination intensity modulating with signal is also helpful in showing signal behaviour. There are also different variants of meters that are not hardware but are rendered in software, these also use variable colour examples.

There are also meters comprising a single LED (light emitting diode) which shows a different colour to indicate the audio signal level. The single LED may be switched-off to indicate very low signal levels. It may show green for low to nominal/moderate levels, with intensity modulation dependent on the signal to show signal strength in this range. The single LED may show yellow for moderate to high levels, again, with intensity modulation dependent on the signal to show signal strength in this range. Finally, the single LED may show red for high to peaking levels, again, with intensity modulation with the signal to show signal strength in this range.

A single LED meter saves space and enables more compact user interface designs; however, it lacks resolution and can be confusing to use. Also, a single LED meter which provides more information than simply three different colours is preferable.

It is desirable to have a meter that provides higher resolution with greater granularity of information on lower level signals, with potentially less colour variance (which can be confusing on the eye across multiple channels) for nominal level signals, and a clear way of showing a warning of high level signals. Above all, each user wants different things from an audio signal meter and to be alerted to different things. Some users may want more resolution at nominal levels in particular instances. Some may want less resolution at nominal levels in particular instances.

BRIEF SUMMARY

In a first aspect, the invention provides a programmable audio level indicator for use with a mixing desk comprising a first light source arranged to emit a coloured light, in response to an audio signal received from a connected audio source, to indicate the audio level of that received signal, the indicator arranged to vary the colour and intensity of the light emitted as the audio level changes, wherein the indicator is configured such that the audio levels at which the colour changes are selectable, the indicator further configured such that the colour emitted to indicate an audio level, or range of audio levels, is also selectable, and wherein the indicator is configured such that a range of audio levels is selectable, over which the intensity of the light emitted changes in response to the change of audio level.

In this way, a user (e.g. a sound engineer using a mixing desk) may customise, or configure, an audio level indicator (or "meter") in accordance with their personal preferences. For instance, the indicator may be configured such that the light shows a particular colour when a level of −8 dBFS is received from the particular incoming audio channel.

The first light source may be RGB LEDs, however, other types of light source are contemplated. The light source is arranged such that it may emit a range of different colours.

The programmable audio level indicator may be further configurable such that a sequence of colours of the light emitted over a range of audio levels, and the range of audio levels concerned, is selectable. For instance, the user may prefer to change from yellow to orange to red over the range −18 dBFS to −3 dBFS.

The programmable audio level indicator may be further configurable such that the intensity of the light emitted in each colour is selectable. The intensity may be selectable for all colours in a single action, rather than on an individual basis.

The programmable audio level indicator may be further configurable such that a range of audio levels is selectable over which the intensity of the light emitted changes in response to the change of audio level. For instance, the user may find it preferable to have the intensity of the light emitted from the light source increase as the audio level increases between a level of −30 dBFS and −18 dBFS.

The programmable audio level indicator may be further configurable such that a range of intensity over which the light is emitted from the first light source in response to the change of received audio level is selectable. The intensity (for example, the brightness) may have a scale of 0% to 100%. The user may find it preferable to set the range of intensity from 30% to 70% source such that the intensity increases from 30% to 70% as the received audio level increases within the range selected above (−30 dBFS and −18 dBFS).

The programmable audio level indicator may be further configurable such that a range of audio levels is selectable over which the intensity of the light emitted remains constant despite a change of audio level. For instance, the user may wish the intensity of the light to remain constant even though the audio level varies between −18 dBFS and −8 dBFS.

The programmable audio level indicator may be further configurable such that a colour indicating that no audio source is connected is selectable.

The programmable audio level indicator may further comprise a second light source configurable to emit a coloured light in response to the audio level of the received audio signal being above a threshold, the indicator configurable such that the threshold value is selectable. For instance, the second light source may be a "peak" signal which illuminates when the threshold audio level is set to −3 dBFS or above.

The second light source may be a single colour LEDs, or it may be a multi-colour LED. However, other types of light source are contemplated.

The programmable audio level indicator may be further configurable such that the intensity of the light emitted from the second light is selectable. For instance, a user may wish the brightness of the second light source to be constant no matter what level the audio signal has above −3 dBFS.

However, it is possible that the programmable audio level indicator is further configurable such that a range of audio levels is selectable over which the intensity of the light emitted from the second light source changes in response to the change of audio level. In other words, the user may wish to set a range of −2 dBFS to −1 dBFS over which the intensity will vary. Likewise, the programmable audio level indicator may be further configurable such that a range of intensity over which the light is emitted from the second light source in response to the change of received audio level is selectable. For instance, the user could set the intensity to vary from 50% at −2 dBFS to 100% at −1 dBFS.

The control of the indicator to select the various criteria described herein and thus configure the indicator may be effected by user input means such as a control panel. The control panel may comprise switches, dials, an output such as screen and the like. It may also include a graphical user interface (GUI) and/or a voice-responsive user interface. For the GUI, this may be presented on a screen. The screen may be touch sensitive.

The visible portion of the indicator light sources may be round in shape; however, other shapes are contemplated.

The programmable audio level indicator may include a number of pre-installed settings which the user may select from. Each setting may have pre-set the following for the first light source; which colour is shown over various different ranges of audio levels, which sequence of colours are shown over various ranges of audio levels, the sequence of colour changes within those ranges, the intensity of the light over various different ranges of audio levels, and the range of intensity to change over various different ranges of audio levels. Each setting may also have pre-set the following settings for the second light source; what colour it uses, at what audio level it illuminates, its intensity, and how its intensity may vary over a range of various audio levels.

The programmable audio level indicator may include one or more processors and/or a storage memory so that it is configurable in the various ways described above.

A mixing desk including the indicator may also include a memory for storing the settings.

In a second aspect, the invention provides a method of programming an audio level indicator for use on a mixing desk wherein the indicator comprises a first light source configurable to emit a coloured light, in response to an audio signal received from a connected audio source, the method comprising the steps of (a) providing a programmable audio level indicator according to the first aspect; (b) selecting the audio levels at which the colour changes; and (c) selecting the colour to be emitted at an audio level, or range of audio levels.

The selection may be achieved by using a control panel and/or screen as described above. For instance, the screen may display drop-down menus, or the like. In this way, the user may customise the indicator in a preferred manner.

The method may further comprise the step of selecting the intensity at which each colour is emitted from the first light source. This may allow the user to set the light intensity to avoid distractions.

The method may further comprise the step of selecting a range of audio levels over which the intensity of the light to be emitted from the first light source changes in response to the change of audio level. The method may further comprise the step of selecting a range of intensity over which the light is to be emitted from the first light source in response to the change of received audio level.

These two steps allow customisation of the indicator brightness over set ranges of audio levels.

The method may further comprise the step of selecting a range of audio levels over which the intensity of the light to be emitted from the first light source remains constant despite a change of audio level. This may be preferable for "nominal" audio levels (for instance between −8 dBFS and −18 dBFS).

The method may further comprise the step of selecting a colour to indicate that no audio source is connected. In this regard, the audio level may be received as less than −68 dBFS. For instance, the colour dark blue may be chosen.

For example, an "open mic" situation, where the received signal is greater than −68 dBFS but less than −48 dBFS, the colour may be chosen as dark green.

The programmable audio level indicator may further comprise a second light source configurable to emit a coloured light in response to the audio level of the received audio signal being above a threshold, and the method may further comprise the step of selecting the threshold value. This may be a peak indicator.

The method may further comprise the step of selecting the intensity of the light to be emitted from the second light source. This may allow the user to set the light intensity to avoid distractions, or to ensure attention is drawn to it.

The method may further comprise the step of selecting a range of audio levels over which the intensity of the light to be emitted from the second light source changes in response to the change of audio level. The method may further comprise the step of selecting a range of intensity over which the light is to be emitted from the second light source in response to the change of received audio level. These two steps allow customisation of the indicator brightness over set ranges of audio levels.

Any, or all, of the steps of selecting criteria and thus controlling the indicator to configure it may be effected by user input means such as a control panel. The control panel may comprise switches, dials, an output such as screen and the like. It may also include a graphical user interface (GUI) and/or a voice-responsive user interface. For the GUI, this may be presented on a screen. The screen may be touch sensitive.

BRIEF DESCRIPTION OF THE DRAWINGS

The above and other characteristics, features and advantages of the present invention will become apparent from the following detailed description, taken in conjunction with the accompanying drawings, which illustrate, by way of example, the principles of the invention. This description is given for the sake of example only, without limiting the scope of the invention. The reference figures quoted below refer to the attached drawings.

FIG. 2 is an example graphical user interface; and

DETAILED DESCRIPTION

Figure 1:
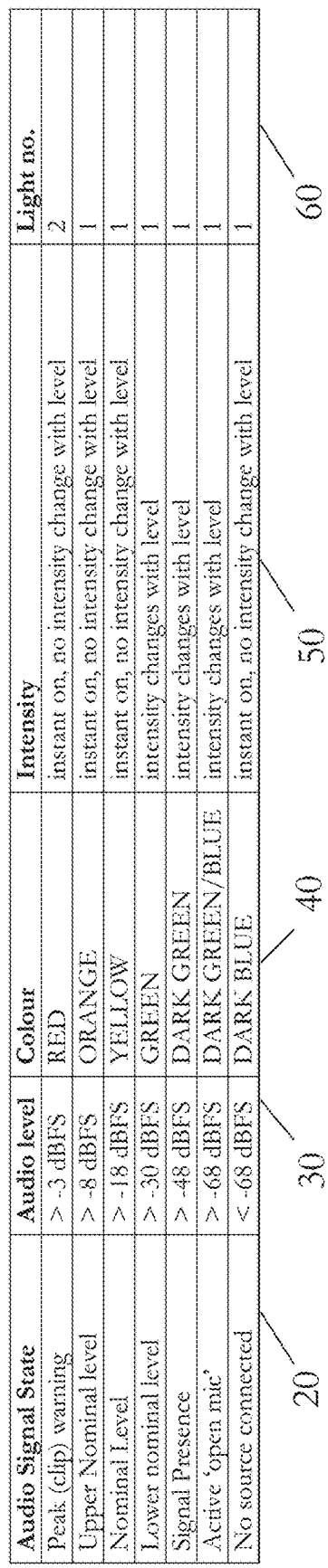
FIG. 1 is a table showing possible settings for an audio level indicator.

The present invention will be described with respect to certain drawings but the invention is not limited thereto but only by the claims. The drawings described are only schematic and are non-limiting. Each drawing may not include all of the features of the invention and therefore should not necessarily be considered to be an embodiment of the invention. In the drawings, the size of some of the elements may be exaggerated and not drawn to scale for illustrative purposes. The dimensions and the relative dimensions do not correspond to actual reductions to practice of the invention.

Furthermore, the terms first, second, third and the like in the description and in the claims, are used for distinguishing between similar elements and not necessarily for describing a sequence, either temporally, spatially, in ranking or in any other manner. It is to be understood that the terms so used are interchangeable under appropriate circumstances and that operation is capable in other sequences than described or illustrated herein.

Moreover, the terms top, bottom, over, under and the like in the description and the claims are used for descriptive purposes and not necessarily for describing relative positions. It is to be understood that the terms so used are interchangeable under appropriate circumstances and that operation is capable in other orientations than described or illustrated herein.

It is to be noticed that the term "comprising", used in the claims, should not be interpreted as being restricted to the means listed thereafter; it does not exclude other elements or steps. It is thus to be interpreted as specifying the presence of the stated features, integers, steps or components as referred to, but does not preclude the presence or addition of one or more other features, integers, steps or components, or groups thereof. Thus, the scope of the expression "a device comprising means A and B" should not be limited to devices consisting only of components A and B. It means that with respect to the present invention, the only relevant components of the device are A and B.

Similarly, it is to be noticed that the term "connected", used in the description, should not be interpreted as being restricted to direct connections only. Thus, the scope of the expression "a device A connected to a device B" should not be limited to devices or systems wherein an output of device A is directly connected to an input of device B. It means that there exists a path between an output of A and an input of B which may be a path including other devices or means. "Connected" may mean that two or more elements are either in direct physical or electrical contact, or that two or more elements are not in direct contact with each other but yet still co-operate or interact with each other. For instance, wireless connectivity is contemplated.

Reference throughout this specification to "an embodiment" or "an aspect" means that a particular feature, structure or characteristic described in connection with the embodiment or aspect is included in at least one embodiment or aspect of the present invention. Thus, appearances of the phrases "in one embodiment", "in an embodiment", or "in an aspect" in various places throughout this specification are not necessarily all referring to the same embodiment or aspect, but may refer to different embodiments or aspects. Furthermore, the particular features, structures or characteristics of any embodiment or aspect of the invention may be combined in any suitable manner, as would be apparent to one of ordinary skill in the art from this disclosure, in one or more embodiments or aspects.

Similarly, it should be appreciated that in the description various features of the invention are sometimes grouped together in a single embodiment, figure, or description thereof for the purpose of streamlining the disclosure and aiding in the understanding of one or more of the various inventive aspects. This method of disclosure, however, is not to be interpreted as reflecting an intention that the claimed invention requires more features than are expressly recited in each claim. Moreover, the description of any individual drawing or aspect should not necessarily be considered to be an embodiment of the invention. Rather, as the following claims reflect, inventive aspects lie in fewer than all features of a single foregoing disclosed embodiment. Thus, the claims following the detailed description are hereby expressly incorporated into this detailed description, with each claim standing on its own as a separate embodiment of this invention.

Furthermore, while some embodiments described herein include some features included in other embodiments, combinations of features of different embodiments are meant to be within the scope of the invention, and form yet further embodiments, as will be understood by those skilled in the art. For example, in the following claims, any of the claimed embodiments can be used in any combination.

In the description provided herein, numerous specific details are set forth. However, it is understood that embodiments of the invention may be practised without these specific details. In other instances, well-known methods, structures and techniques have not been shown in detail in order not to obscure an understanding of this description.

In the discussion of the invention, unless stated to the contrary, the disclosure of alternative values for the upper or lower limit of the permitted range of a parameter, coupled with an indication that one of said values is more highly preferred than the other, is to be construed as an implied statement that each intermediate value of said parameter, lying between the more preferred and the less preferred of said alternatives, is itself preferred to said less preferred value and also to each value lying between said less preferred value and said intermediate value.

The use of the term "at least one" may mean only one in certain circumstances.

The principles of the invention will now be described by a detailed description of at least one drawing relating to exemplary features of the invention. It is clear that other arrangements can be configured according to the knowledge of persons skilled in the art without departing from the underlying concept or technical teaching of the invention, the invention being limited only by the terms of the appended claims.

FIG. 1 shows a table 10 of a summary of example settings a user may enter to configure the indicator. From left to right, the columns are Audio Signal State 20, Audio level 30, Colour 40, Intensity 50, Light no. 60.

With regard to the audio levels, the units are shown as dBFS. It is to be understood that other units such as dBmeter, dBu and dBV may be employed.

The column headed "Light no." 60 refers to which of the two (if there are two) light sources are used for which signal state. The "2", in the column below, refers to the second light source (used as a peak indicator), whereas the "1" refers to the first light source.

A "peak (clip) warning" of >−3 dBFS is shown as having the colour red on light number 2, with a fixed intensity The "upper nominal level" of >−8 dBFS is shown as having the colour orange, with a fixed intensity.

The "nominal level" of >−18 dBFS is shown as having the colour yellow, with a fixed intensity.

The "lower nominal level" of >−30 dBFS is shown as having the colour green, wherein the intensity changes with the change in audio level.

A "signal presence" of >−48 dBFS is shown as having the colour dark green, wherein the intensity changes with the change in audio level.

An "active open mic" of >−68 dBFS is shown as having the colour dark green/blue, wherein the intensity changes with the change in audio level.

With no source connected the colour is selected as dark blue, with no intensity change.

In use, with the settings configured as above, lamp number 1 will change colours as the audio level is received in the range >−30 dBFS to >−8 dBFS with a sequence of green, yellow and then orange. The lower nominal level ranges from −30 dBFS to −18 dBFS and as the audio level received moves through this range the intensity of the colour green will change since that is what was selected.

If the user had selected some other colours and/or sequence (such as yellow, red, purple), and/or intensity variation with audio level this would be shown instead in the table.

If the audio level received is above −3 Dbfs then lamp number 2 will illuminate with the colour red.

FIG. 2 shows an example graphical user interface (GUI) 100 which may be provided on a screen for configuring the indicators.

The GUI comprises five columns with headings the same as in FIG. 1. There are seven rows for the various signal states, namely: peak (clip) warning, upper nominal level, nominal level, lower nominal level, signal presence, active open mic, no source connected. The lower level defining each of these signal states may be configurable by using up and down arrows 110 provided in each row in the audio level column 30. In this way, a user may select to increase or decrease the lower level for each state. In this regard, it is contemplated that the indicator could be arranged such that it is the upper limit for each signal state rather than the lower limit. Combination so upper and lower limits may also be configured using a suitable GUI.

Likewise, the colour column 40 includes up and down arrows 120 to choose the colour for that particular signal state. In the intensity column 50 it is possible to choose whether the intensity is to change as the audio level changes in that range of levels. This may be effected by using up and down arrows 130. Finally, in the last column titled "Light no." 60, it is possible to use up and down arrows 140 to select which LED is to illuminate for each specific signal state if the audio level received falls within that particular signal state.

Although not shown, it is possible for the GUI to also include controls for configuring the range of intensity (for instance from 0% to 100%) for each signal state which has the "intensity changes with level" selected.

Furthermore, the GUI may include icons, rather than buttons with words and numbers, for configuring the settings.

Figure 3:
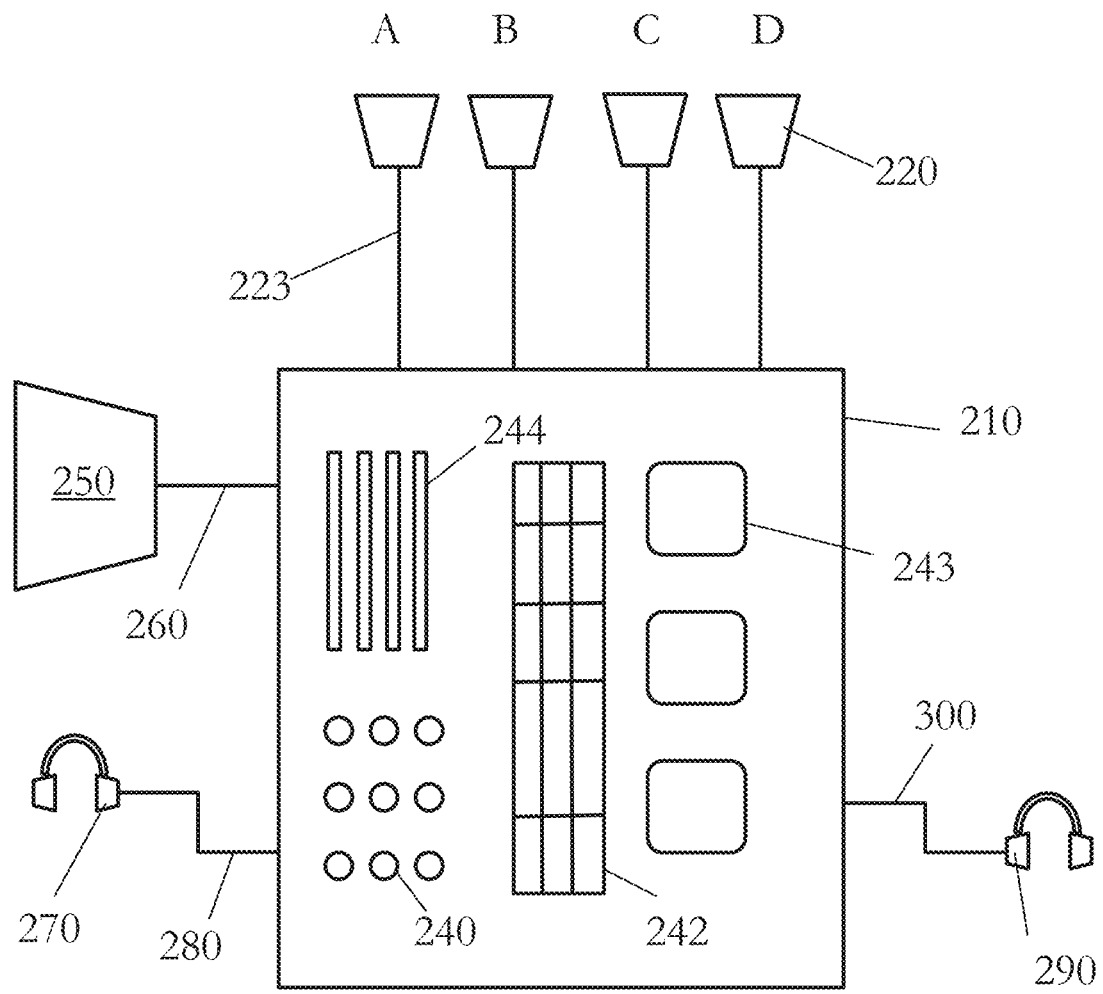
FIG. 3 is a schematic representation of a mixing console.

FIG. 3 is a schematic drawing of a mixing console 210. In this example, the mixing console is for receiving sound signals from performers, for processing those signals to provide a master output mix for the audience and auxiliary mix signals for at least one performer.

The sound sources are referenced "A", "B", "C" and "D". The sounds are received by microphones 220. These microphones are connected to the mixing console 210 by cables 230.

The console includes various controls and indicators 240, 242, 243, 244 for controlling its operation. Some of these may be programmable audio level indicators according to the invention. Others may be user input means including a graphical user interface and/or a voice-responsive user interface according to the invention. Others may allow the console to be configured to process and/or combine a selected input signal from sources A, B, C, D or a group of selected input signals. Still others may control how the input signals from sources A, B, C, D are to be processed and combined in different combinations.

A master mix output is transmitted via cable 260 to loudspeakers 250. This may be the combination of the input signals from sources A, B, C, D processed to provide an optimum output as determined by the operator of the console.

A pair of headphones 270 is also connected to the console 210 by another cable 280. These headphones may be worn by one of the performers. They may receive a first auxiliary mix output from the console 210 which is a combination of only three of the four input signals from sources B, C, D. This combination may also include processing which is different from the processing creating the master output mix.

Another pair of headphones 290 is also connected to the console 210 by another cable 300. These headphones may be worn by another of the performers.

While various embodiments of programmable audio level indicators and methods for using the same have been described in considerable detail herein, the embodiments are merely offered as non-limiting examples of the disclosure described herein. It will therefore be understood that various changes and modifications may be made, and equivalents may be substituted for elements thereof, without departing from the scope of the present disclosure. The present disclosure is not intended to be exhaustive or limiting with respect to the content thereof.

Further, in describing representative embodiments, the present disclosure may have presented a method and/or a process as a particular sequence of steps. However, to the extent that the method or process does not rely on the particular order of steps set forth therein, the method or process should not be limited to the particular sequence of steps described, as other sequences of steps may be possible. Therefore, the particular order of the steps disclosed herein should not be construed as limitations of the present disclosure. In addition, disclosure directed to a method and/or process should not be limited to the performance of their steps in the order written. Such sequences may be varied and still remain within the scope of the present disclosure.

The invention claimed is:

1. A programmable audio level indicator for use with a mixing desk comprising a first light source arranged to emit a coloured light, in response to an audio signal received from a connected audio source, to indicate the audio level of that received signal, the indicator arranged to vary the colour and intensity of the light emitted as the audio level changes, wherein the indicator is configured such that the audio levels at which the colour changes are selectable, the indicator further configured such that the colour emitted to indicate an audio level, or range of audio levels, is also selectable, and wherein the indicator is configured such that a range of audio levels is selectable, over which the intensity of the light emitted changes in response to the change of audio level.

2. The programmable audio level indicator of claim 1, further configured such that a sequence of colours of the light emitted over a range of audio levels, and the range of audio levels concerned, is selectable.

3. The programmable audio level indicator of claim 1, further configured such that a range of intensity over which the light is emitted from the light source in response to the change of received audio level is selectable.

4. The programmable audio level indicator of claim 1, further configured such that a range of audio levels is selectable over which the intensity of the light emitted remains constant despite a change of audio level.

5. The programmable audio level indicator of claim 1, further configured such that a colour indicating that no audio source is connected is selectable.

6. The programmable audio level indicator of claim 1, further comprising a second light source arranged to emit a coloured light in response to the audio level of the received audio signal being above a threshold, the indicator configured such that the threshold value is selectable.

7. The programmable audio level indicator of claim 6, further configured such that the intensity of the light emitted from the second light is selectable.

8. The programmable audio level indicator of claim 7, further configured such that a range of audio levels is selectable over which the intensity of the light emitted from the second light source changes in response to the change of audio level.

9. The programmable audio level indicator of claim 8, further configured such that a range of intensity over which the light is emitted from the second light source in response to the change of received audio level is selectable.

10. The programmable audio level indicator of claim 1, including a control panel to selectively configure the indicator.

11. The programmable audio level indicator of claim 1, including a graphical user interface to selectively configure the indicator.

12. The programmable audio level indicator of claim 1, including a voice-responsive user interface to selectively configure the indicator.

13. A method of programming an audio level indicator for use on a mixing desk wherein the indicator comprises a first light source configured to emit a coloured light, in response to an audio signal received from a connected audio source, the method comprising the steps of:
    (a) providing a programmable audio level indicator according to claim 1;
    (b) selecting the audio levels at which the colour changes;
    (c) selecting the colour to be emitted at an audio level, or range of audio levels; and
    (d) selecting a range of audio levels over which the intensity of the light to be emitted changes in response to the change of audio level.

14. The method of claim 13, further comprising the step of selecting a range of intensity over which the light is to be emitted from the light source in response to the change of received audio level.

15. The method of claim 13, further comprising the step of selecting a range of audio levels over which the intensity of the light to be emitted remains constant despite a change of audio level.

16. The method of claim 13, further comprising the step of selecting a colour to indicate that no audio source is connected.

17. The method of claim 13, wherein the programmable audio level indicator further comprises a second light source configured to emit a coloured light in response to the audio level of the received audio signal being above a threshold, the method further comprising the step of selecting the threshold value.

18. The method of claim 17, further comprising the step of selecting the intensity of the light to be emitted from the second light source.

19. The method of claim 17, further comprising the step of selecting a range of audio levels over which the intensity of the light to be emitted from the second light source changes in response to the change of audio level.

20. The method of claim 19, further comprising the step of selecting a range of intensity over which the light is to be emitted from the second light source in response to the change of received audio level.

* * * * *